(12) United States Patent
Yao

(10) Patent No.: US 7,671,986 B2
(45) Date of Patent: Mar. 2, 2010

(54) SPECTROSCOPY APPARATUS BASED ON HETERO-JUNCTION PHOTOTRANSISTORS

(75) Inventor: Jie Yao, Princeton, NJ (US)

(73) Assignee: BWT Property, Inc, Newark, DE (US)

( * ) Notice: Subject to any disclaimer, the term of this patent is extended or adjusted under 35 U.S.C. 154(b) by 0 days.

(21) Appl. No.: 12/182,288

(22) Filed: Jul. 30, 2008

(65) Prior Publication Data

US 2010/0020320 A1   Jan. 28, 2010

Related U.S. Application Data

(60) Provisional application No. 60/952,600, filed on Jul. 30, 2007.

(51) Int. Cl.
  *G01J 3/28* (2006.01)

(52) U.S. Cl. .................................................... 356/326
(58) Field of Classification Search ................ 356/319, 356/301; 257/291–293, 184, 189, E31.099; 250/200–239
See application file for complete search history.

(56) References Cited

U.S. PATENT DOCUMENTS

2005/0068517 A1*   3/2005   Evans et al. ................ 356/5.01

\* cited by examiner

*Primary Examiner*—Kara E Geisel
*Assistant Examiner*—Abdullahi Nur
(74) *Attorney, Agent, or Firm*—Frank F. Tian

(57) ABSTRACT

This invention discloses a variety of spectroscopy apparatus based on high sensitivity photo detector arrays and image sensors employing sidewall-passivated mesa-structure hetero-junction phototransistors (HPTs).

26 Claims, 4 Drawing Sheets

SPECTROSCOPY APPARATUS BASED ON HETERO-JUNCTION PHOTOTRANSISTORS

REFERENCE TO RELATED APPLICATION

This application claims an invention which was disclosed in Provisional Patent Application No. 60/952,600, filed Jul. 30, 2007, entitled "SPECTROSCOPY APPARATUS BASED ON HETERO-JUNCTION PHOTOTRANSISTORS". The benefit under 35 USC 119(e) of the above mentioned United States Provisional Applications is hereby claimed, and the aforementioned application is hereby incorporated herein by reference.

The present application further incorporates by reference U.S. Pat. No. 7,067,853 to Yao filed on Mar. 18, 2005, whose disclosure is hereby incorporated by reference in its entirety into the present disclosure.

FIELD OF THE INVENTION

This invention generally relates to a spectroscopy apparatus, and more specifically to a spectroscopy apparatus based on photo detectors and photo detector arrays containing hetero-junction phototransistors (HPTs).

BACKGROUND

Spectroscopy is widely used in physical and analytical chemistry as well as in industrial applications for the identification of substances through the spectra emitted from or absorbed by them. Spectroscopy apparatus in the visible wavelength generally employs a diffractive grating or a dispersive prism together with a photo detector array, such as a CCD or CMOS image sensor. While in the near infrared (NIR) to infrared (IR) wavelength, spectroscopic analysis is generally performed with a Michelson interferometer (a so-called Fourier transform spectrograph) and a single element photo detector due to the lack of appropriate high-sensitivity and low-cost array detectors. The Fourier transform spectrograph suffers from a relatively low scanning speed and long-term stability and repeatability problems due to the existence of mechanical moving parts. There thus exists a need for an improved NIR or IR spectroscopy apparatus which solves the above mentioned problems.

SUMMARY OF THE INVENTION

The present invention discloses a variety of spectroscopy apparatus, which utilize a high sensitivity photo detector array or image sensor based on a hetero-junction phototransistor (HPT) as disclosed in U.S. Pat. No. 7,067,853 by Yao who is the same inventor of the present application. The disclosure is hereby incorporated herein by reference. The photo detector array or image sensor separates the low-noise, high-speed detection and amplification in the HPT from the high-speed serialization and readout in the CCD or CMOS readout circuit, with high-gain low-noise amplification as the noise isolation buffer between the two processes. The HPT may be made of group III-V semiconductors, such as GaAs, InGaAs, AlGaAs, InP, InAlAs, InAlAsP, InGaAsP, InAlGaAs, InGaP, GaN, InGaN, InN, etc. or group IV semiconductors, such as Si, Si/Ge, Si/Ge/C, etc., with suitable p- and n-type dopants.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
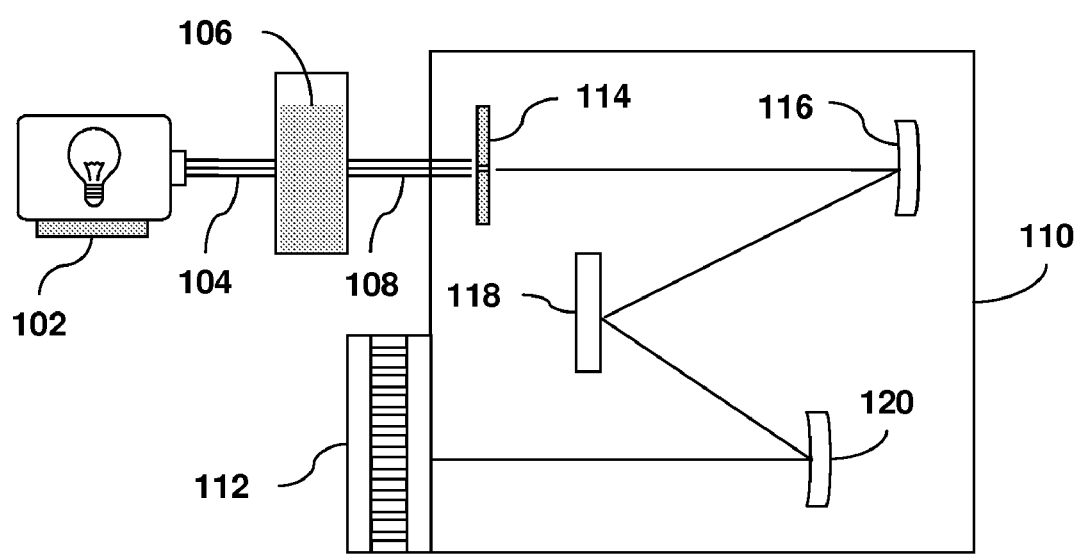
FIG. 1 illustrates an absorption/transmission spectroscopy system employing an HPT-based array sensor.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to a spectroscopy apparatus based on a photo detector array containing hetero-junction phototransistors (HPTs). Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms, such as first and second, top and bottom, and the like, may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Before we give the detailed descriptions of our spectroscopy systems, we define an HPT array to be a photo detector array wherein each pixel of the array is an HPT. An HPT-based array, in contrast, is defined as a photo detector array wherein each pixel of the array contains an HPT and may or may not contain other circuit elements, device components or structures. Thus, the latter is a much broader concept inclusive of the former.

All optical signals can be either transmitted in free space or in optical fibers or in a combination of both. The optical signal paths in FIGS. 1 through 4 do not indicate our choice of free space optics or fiber optics.

In the first preferred embodiment of the present invention, a high sensitivity absorption/transmission spectroscopy system is constructed with an HPT-based array sensor. Referring to FIG. 1, a tungsten light source 102 provides a stable input light beam 104 with a spectral coverage spanning from 380 to 2900 nm. The input light beam 104 transmits through a liquid, gas or solid sample 106, where part of the light is absorbed at certain wavelengths characteristic to the sample 106. The transmitted light beam 108 is then collected and measured by a spectrograph device such as a Czerny-Turner spectrograph 110 built on an HPT-based array sensor 112. The Czerny-Turner spectrograph 110 further comprises an entrance slit 114, for the transmitted light to pass through, and a collimating mirror 116, a diffractive grating 118, and a focusing mirror 120, all of which disperse the light beam in space and form a plurality of monochromatic images of the entrance slit 114 onto the plane of the HPT-based array sensor 112. The intensity of the plurality of images is measured by the HPT-based array sensor 112 to obtain an absorption/transmission spectrum of the sample 106. As disclosed in U.S. Pat. No. 7,067,853, the HPT-based array sensor 112 may comprise a high sensitivity sidewall-passivated mesa-structure HPT-based array plus a high speed CCD or CMOS readout circuit. Alternatively, the HPT-based array sensor 112 may comprise an HPT-based array and an LED array flip-chip boned together plus a CCD or CMOS image sensor. In this embodiment, the HPT is preferably made of InGaAs/InP material for near infrared (NIR) detection. The HPT-based array sensor 112 provides a gain of beta (typically beta>1000) over conventional p-i-n InGaAs array detectors, which means its sensitivity is increased by beta (typically beta>1000) times. In the meantime, trench isolation and sidewall passivation of the HPT help to reduce its dark current in the pico-Ampere (pA) range or below and maintain high amplification gain at low levels of injection. This allows the HPT-based array sensor to operate even under room temperature without active cooling. The pixel size of the HPT-based array can be reduced to less than 10 miro-meters (<10 μm), thanks to the small crosstalk provided by trench isolation. In a slight variation of the present embodiment, a CCD or CMOS sensor can be used in combination with the HPT-based array sensor to provide a broader spectral coverage from ultraviolet (UV) (e.g. <200 nm) to NIR. In addition, a cavity ring-down spectroscopy technique can be used to further enhance the sensitivity of the spectroscopy system.

Figure 2:
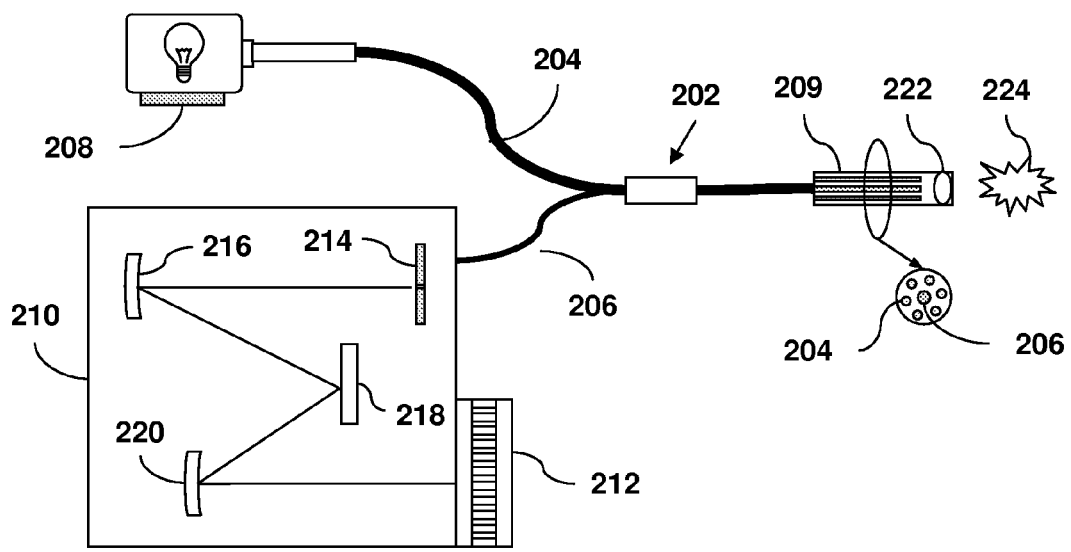
FIG. 2 illustrates a diffuse/reflectance spectroscopy system employing an HPT-based array sensor.

In the second preferred embodiment of the present invention, a high sensitivity diffuse/reflectance spectroscopy system is constructed with an HPT-based array sensor. Referring to FIG. 2, a fiber optic diffuse/reflectance probe 202 with six illumination fibers 204 and one collection fiber 206 is used for sample illumination and reflectance collection. The termination end with six fibers 204 is connected to a light source 208 such as a tungsten light source, and the single fiber end 206 is connected to a Czerny-Turner spectrograph 210 built on an HPT-based array sensor 212. The common end of the fiber probe 202 is terminated into a pen-like rod 209 with the single collection fiber 206 surrounded by six illumination fibers 204. A lens 222 is used to deliver the illumination light and collect the diffuse/reflectance optical signal from the sample 224, which can be placed in close contact or proximity to the probe 202. This probe design helps to reduce the specular reflectance to a minimum value. A reflectance standard with known spectral reflectivity such as polytetrafluoroethylene (PTFE) can serve as a reference. The Czerny-Turner spectrograph 210 further comprises an entrance slit 214, a collimating mirror 216, a diffractive grating 218, and a focusing mirror 220, all of which disperse the optical signal in spatial domain to be measured with the HPT-based array sensor 212 to obtain an diffuse/reflectance spectrum of the sample 224. The advantages of HPT-based array sensor 112 described supra in FIG. 1 is hereby incorporated herein by references.

In the third preferred embodiment of the present invention, a Raman spectroscopy system is constructed with an HPT-based array sensor. Raman spectroscopy is a spectroscopic technique used to study molecular vibrational, rotational, and other low-frequency modes in a sample. To minimize the influence of fluorescence, which is typically six orders of magnitude stronger than the Raman signal, Raman spectroscopy has now shifted to near infrared excitation with lasers at about or around 800 nm wavelength range. Although longer excitation wavelengths would further suppress fluorescence, they produce much weaker Raman signals because the Raman signal is proportional to $\lambda^{-4}$ ($\lambda$ is the wavelength of the excitation laser). In addition, a silicon based CCD detector becomes less useful because detector efficiency drops off sharply from 1000 to 1100 nm. Moreover, certain applications set a limit for maximum laser intensity to prevent sample damage. There thus exists a need for a high sensitivity, low noise infrared image sensor to detect the weak Raman signal excited by low power infrared lasers at the highly preferred wavelengths of around and above 1000 nm, where the sample fluorescence is significantly suppressed and narrow linewidth diode lasers, such as those distributed feedback (DFB) lasers developed for optical communication applications, are readily available.

Figure 3:
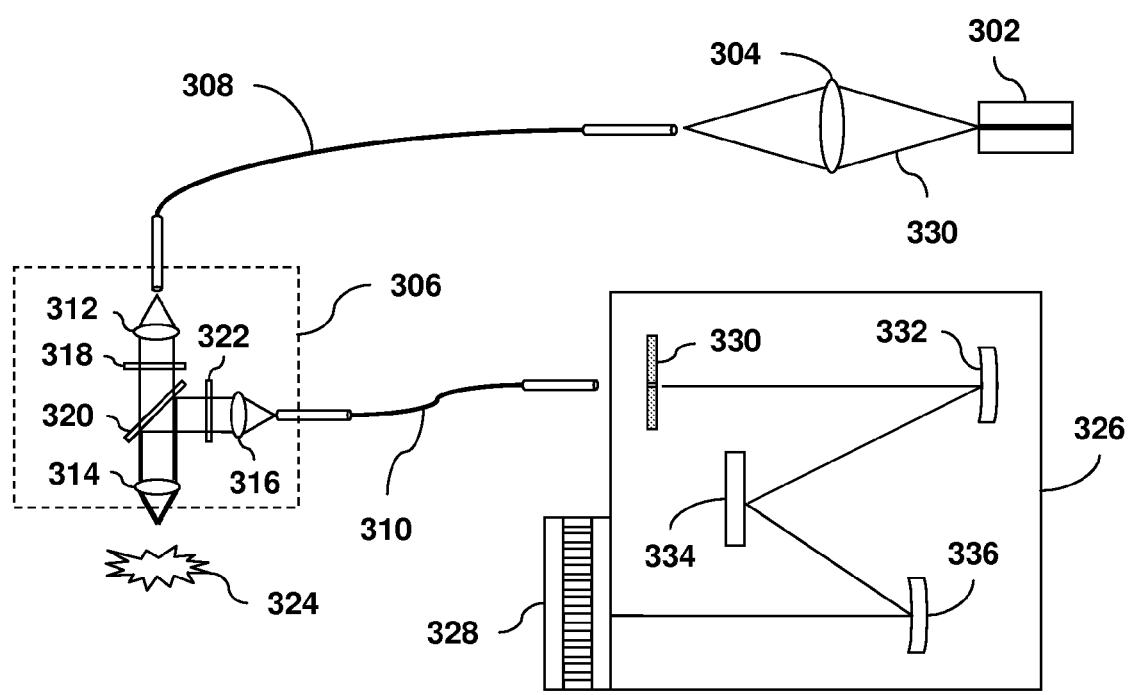
FIG. 3 illustrates a Raman spectroscopy system employing an HPT-based array sensor.

Referring to FIG. 3, the Raman spectroscopy apparatus comprises an excitation laser 302, a fiber optic probe 306, and a Czerny-Turner spectrograph 326 built on a highly sensitive HPT-based array sensor 328. The excitation laser 302 is preferably an NIR diode laser with an emission wavelength of around and above 800 nm to induce minimum fluorescence from the sample 324. The linewidth of the laser can be narrowed through distributed Bragg reflector (DBR), distributed feedback (DFB) structures or through an external cavity employing volume Bragg gratings (VBGs). The laser beam 330 produced by the excitation laser 302 is focused by a lens 304 into an excitation fiber 308 of the fiber optic probe 306. The fiber optical probe 306 further comprises a collimating lens 312, a bandpass laser line filter 318, a dichroic filter 320, and a probe lens 314 to deliver the laser beam to the sample 324 to excite Raman scattering. The Raman scattering signal is collected by the probe lens 314, the dichroic filter 320, and a longpass filter 322 to remove Rayleigh scattering and finally focused into a collection fiber 310 of the fiber optic probe 306 by a focusing lens 316. Through the collection fiber 310, the Raman signal is delivered into the HPT based NIR spectrograph 326 for spectrum analysis. The spectrograph 326 further comprises an entrance slit 330, a collimating mirror 332, a diffractive grating 334, and a focusing mirror 336, all of which disperse the Raman signal in spatial domain to be measured with the HPT-based array sensor 328. The HPT-based array sensor 328 is preferably made of InGaAs/InP material for NIR detection. Strained InGaAs, strain-compensated InGaAs, and nitrogen-containing III-V semiconductors have been proven to extend further into the infrared region. The large gain provided by the HPT-based array greatly improves the sensitivity of the spectrograph, making it possible to detect the weak Raman signal excited by long wavelength NIR lasers. The enhanced fluorescence suppression is important for measuring the Raman spectrum for some highly fluorescent samples, such as some biological samples. In a slight variation of the present embodiment, the Raman signal can be enhanced through resonant Raman effect and/or surface enhanced Raman effect. The advantages of HPT-based array sensor 112 described supra in FIG. 1 is hereby incorporated herein by references.

Figure 4:
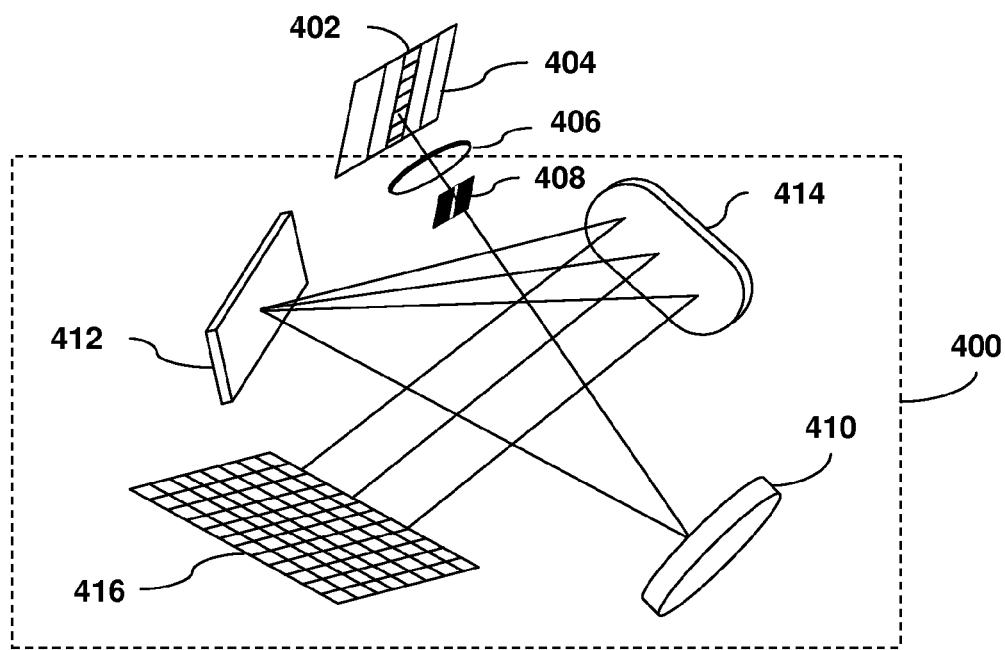
FIG. 4 illustrates an imaging spectrometer employing an HPT-based array image sensor.

In the fourth preferred embodiment of the present invention, a 2-dimensional (2-D) HPT-based array image sensor is utilized to construct an imaging spectrometer. Referring to FIG. 4, the optical signal from a section 402 of the physical object 404 is focused onto the entrance slit 408 of the imaging spectrometer 400 through a lens 406. The direction of the entrance slit 408, i.e. the direction along the longitudinal side of the entrance slit 408, defines the first physical dimension of the object 404 to be imaged. The optical signal can be a diffuse/reflectance optical signal, a fluorescence signal, or a Raman scattering signal from the object. The optical signal is then collimated by a collimating mirror 410 and delivered to a diffractive grating 412, which disperses the optical signal in a direction perpendicular to the longitudinal side of the entrance slit 408. The dispersed optical signal is focused onto the 2-D HPT-based array image sensor 416 through a focusing mirror 414 to form multiple images of the section 402 of the physical object 404 in different wavelengths. By scanning the imaging spectrometer 400 across the object 404 in a direction perpendicular to the first physical dimension (this direction defines the second physical dimension of the object 404 to be imaged), a hyperspectral image of the object 404 in two physical dimensions is obtained. The HPT-based array image sensor 416 provides wide wavelength coverage from visible to near infrared (NIR) (0.75-1.4 µm) or even short-wavelength infrared (SWIR) (1.4-3 µm), which are not available for any known image sensor demonstrated before. The advantages of HPT-based array sensor 112 described supra in FIG. 1 is hereby incorporated herein by references.

In the fifth preferred embodiment (not shown), Fourier transformation spectroscopy systems can also benefit from the intrinsic low noise, high speed, and high gain of an HPT photo detector instead of the conventional p-i-n photodiode, avalanche photodiode (APD), Geiger mode APD, and photo-multiplication tube (PMT).

In the above disclosed embodiments, the spectrograph adopts a Czerny-Turner optical bench. It is possible to utilize other type of optical benches, such as those based on concave holographic gratings and/or axial optic geometries for improved imaging quality and reduced stray light. The HPT-based array may be made of other semiconductor materials to operate in the other wavelength bands.

In the foregoing specification, specific embodiments of the present invention have been described. However, one of ordinary skill in the art appreciates that various modifications and changes can be made without departing from the scope of the present invention as set forth in the claims below. For example, the HPT sensor may be used for other types of spectroscopy analysis, such as laser induced breakdown spectroscopy (LIBS). Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for measuring the spectrum of an optical signal, the method comprising the steps of:
    providing a dispersive element to disperse the optical signal as a function of wavelength; and
    providing a hetero-junction phototransistor (HPT)-based array sensor coupled to the dispersive element to measure an intensity of the dispersed optical signal and obtain a spectrum of the optical signal;
    wherein the HPT-based array sensor comprises a sidewall-passivated mesa-structure HPT-based array and a CCD or CMOS readout circuit.

2. The method of claim 1, wherein the HPT-based array sensor comprises a LED array electrically connected to the sidewall-passivated mesa-structure HPT-based array and a CCD or CMOS image sensor optically connected to the LED array.

3. The method of claim 2, wherein the HPT-based array and the LED array are flip-chip bonded together.

4. The method of claim 1, wherein the HPT is made predominantly of group III-V semiconductor materials.

5. The method of claim 1, wherein the HPT is made predominantly of group IV semiconductor materials.

6. The method of claim 1, wherein the optical signal is a transmitted optical signal from a physical object.

7. The method of claim 1, wherein the optical signal is a diffused/reflected optical signal from a physical object.

8. The method of claim 1, wherein the optical signal is a Raman scattering signal from a physical object.

9. The method of claim 8, wherein the Raman scattering signal is a surface enhanced Raman scattering signal from a physical object.

10. The method of claim 1, wherein the optical signal is a fluorescence signal from a physical object.

11. The method of claim 1, wherein the optical signal is a laser induced breakdown spectroscopy (LIBS) signal from a physical object.

12. The method of claim 1, further comprising the step of providing a 2-dimensional heterojunction phototransistor (HPT)-based array sensor with one of the dimensions in the HPT-based array sensor aligned to the direction of dispersion of the dispersive element, and with the second dimension in the HPT-based array sensor for imaging in one dimension in a physical space.

13. The method of claim 12, further comprising the step of scanning across a second dimension in the physical space, and obtaining the spectrum in two physical dimensions.

14. A device for measuring the spectrum of an optical signal comprising:
    a dispersive element to disperse the optical signal as a function of wavelength; and
    a hetero-junction phototransistor (HPT)-based array sensor coupled to the dispersive element to measure an intensity of the dispersed optical signal and obtain a spectrum of the optical signal;
    wherein the HPT-based array sensor comprises a sidewall-passivated mesa-structure HPT-based array and a CCD or CMOS readout circuit.

15. The device of claim 14, wherein the HPT-based array sensor comprises a LED array electrically connected to the sidewall-passivated mesa-structure HPT-based array and a CCD or CMOS image sensor optically connected to the LED array.

16. The method of claim 15, wherein the HPT-based array and the LED array are flip-chip bonded together.

17. The device of claim 14, wherein the HPT is made predominantly of group III-V semiconductor materials.

18. The device of claim 14, wherein the HPT is made predominantly of group IV semiconductor materials.

19. The device of claim 14, wherein the optical signal is a transmitted optical signal from a physical object.

20. The device of claim 14, wherein the optical signal is a diffused/reflected optical signal from a physical object.

21. The device of claim 14, wherein the optical signal is a Raman scattering signal from a physical object.

22. The method of claim 21, wherein the Raman scattering signal is a surface enhanced Raman scattering signal from a physical object.

23. The device of claim 14, wherein the optical signal is a fluorescence signal from a physical object.

24. The device of claim 14, wherein the optical signal is a laser induced breakdown spectroscopy (LIBS) signal from a physical object.

25. The device of claim 14, wherein the heterojunction phototransistor (HPT)-based array sensor comprises a 2-dimensional HPT-based array sensor with one of the dimensions in the HPT-based array sensor aligned to the direction of dispersion of the dispersive element, and with a second dimension in the HPT-based array sensor for imaging in one dimension in a physical space.

26. The device of claim 25, further comprising means for scanning across a second dimension in the physical space, and obtaining the spectrum in two physical dimensions.

* * * * *